US010193041B1

(12) United States Patent
Lin et al.

(10) Patent No.: US 10,193,041 B1
(45) Date of Patent: Jan. 29, 2019

(54) LIGHT EMITTING DIODE AND METHOD FOR MANUFACTURING THE SAME

(71) Applicant: ADVANCED OPTOELECTRONIC TECHNOLOGY, INC., Hsinchu, Hsien (TW)

(72) Inventors: Shih-Chuan Lin, Hsinchu (TW); Tsung-Han Chiang, Hsinchu (TW); Chun-Yao Lin, Hsinchu (TW); Chao-Ming Huang, Hsinchu (TW); Hsiu-Ling Hung, Hsinchu (TW); Tzu-Chien Hung, Hsinchu (TW)

(73) Assignee: ADVANCED OPTOELECTRONIC TECHNOLOGY, INC, Hsinchu Hsien (TW)

(*) Notice: Subject to any disclaimer, the term of this patent is extended or adjusted under 35 U.S.C. 154(b) by 0 days.

(21) Appl. No.: 15/814,507

(22) Filed: Nov. 16, 2017

(30) Foreign Application Priority Data

Oct. 20, 2017 (CN) .......................... 2017 1 0986723

(51) Int. Cl.
*H01L 21/71* (2006.01)
*H01L 33/62* (2010.01)
*H01L 33/00* (2010.01)
*H01L 33/24* (2010.01)

(52) U.S. Cl.
CPC .............. *H01L 33/62* (2013.01); *H01L 21/71* (2013.01); *H01L 33/005* (2013.01); *H01L 33/24* (2013.01)

(58) Field of Classification Search
CPC ....... H01L 21/71; H01L 33/62; H01L 33/005; H01L 33/24
See application file for complete search history.

(56) References Cited

U.S. PATENT DOCUMENTS

| 2012/0261693 | A1* | 10/2012 | Chen ..................... H01L 33/642 257/98 |
| 2013/0009196 | A1* | 1/2013 | Iwanaga ............... H01L 33/382 257/99 |
| 2015/0243853 | A1* | 8/2015 | Cha ........................ H01L 33/486 438/27 |
| 2016/0240744 | A1* | 8/2016 | Huang .................... H01L 33/62 |

* cited by examiner

*Primary Examiner* — Douglas Menz
(74) *Attorney, Agent, or Firm* — ScienBiziP, P.C.

(57) ABSTRACT

A light emitting diode comprises a light emitting diode chip and a packaging layer. The light emitting diode chip comprises a N-semiconductor layer, a light active layer, and a P-semiconductor layer arranged from a bottom to a top in that sequence, a first electrode, and a second electrode. The first electrode is formed on the P-semiconductor layer. The second electrode is formed on the N-semiconductor layer. The packaging layer covers the light emitting diode chip, and exposes the N-semiconductor layer, the first electrode, and the second electrode. The packaging layer has a through hole separated from a periphery of the light emitting diode chip. A conductive substrate fills the through hole. A first conductive layer is electrically connected to the first electrode and the conductive substrate. The disclosure also provides a method for manufacturing a light emitting diode.

7 Claims, 7 Drawing Sheets

US 10,193,041 B1

LIGHT EMITTING DIODE AND METHOD FOR MANUFACTURING THE SAME

FIELD

The subject matter herein generally relates to a light emitting diode and a method for manufacturing the light emitting diode.

BACKGROUND

Light emitting diode (LED) is a semiconductor device for converting current to light. The light emitting diode is widely used in lighting, because the light emitting diode has advantages of high brightness, low voltage, long life, environmentally friendly etc. Electrodes are on a side of the light emitting diode, so that it takes a long time to install the light emitting diode.

BRIEF DESCRIPTION OF THE DRAWINGS

Implementations of the present technology will now be described, by way of example only, with reference to the attached figures.

DETAILED DESCRIPTION

Figure 1:
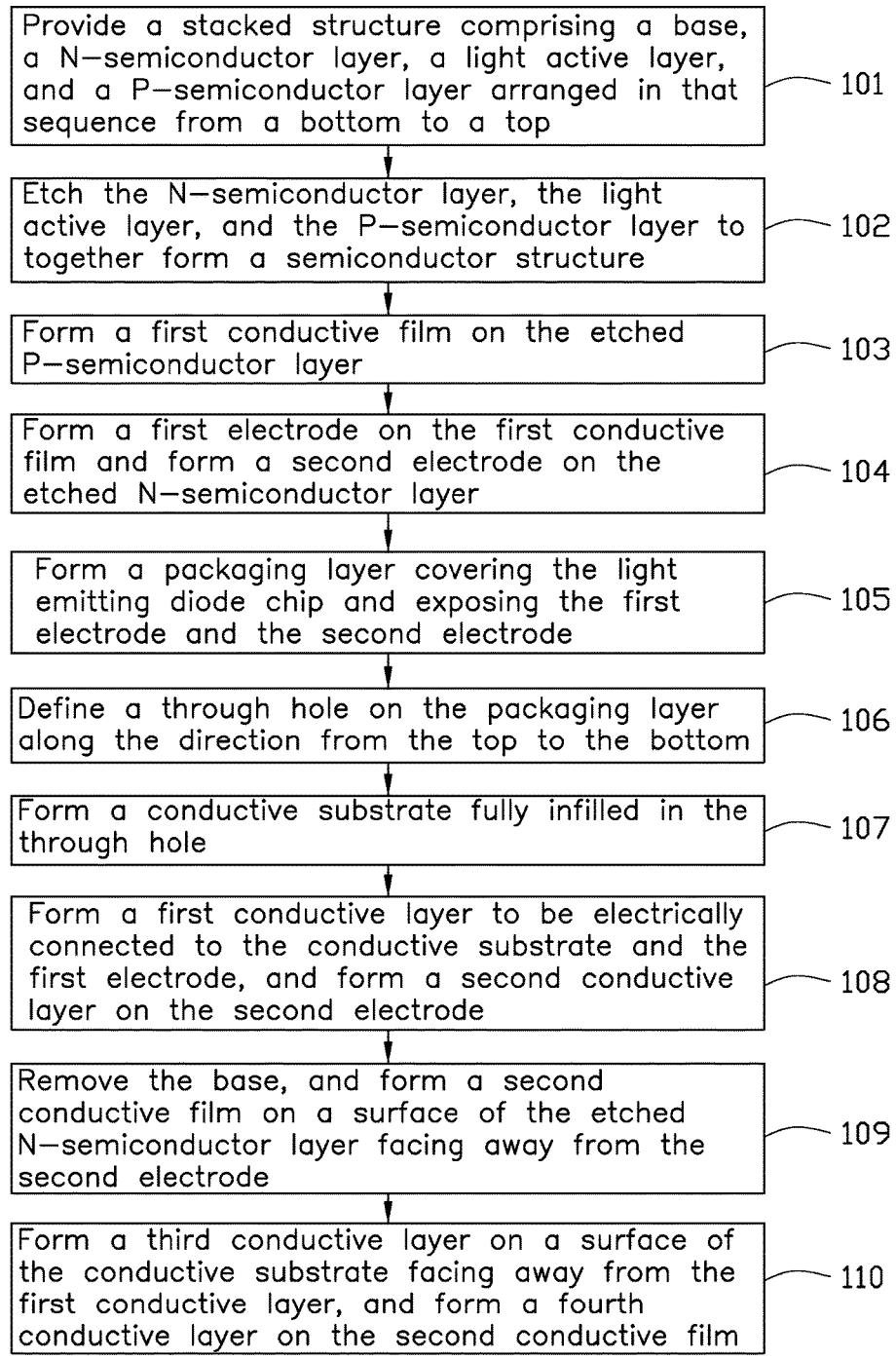
FIG. 1 is a flowchart of an exemplary embodiment of a method for manufacturing a light emitting diode.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a flowchart of a method in accordance with an exemplary embodiment. The exemplary method for manufacturing a light emitting diode 100 (shown in FIG. 11) is provided by way of example only, as there are a variety of ways to carry out the method. Each block shown in FIG. 1 represents one or more processes, methods, or subroutines carried out in the exemplary method. Furthermore, the illustrated order of blocks is by example only and the order of the blocks can be changed. Additional blocks may be added or fewer blocks may be utilized, without departing from this disclosure. The exemplary method can begin at block 101.

Figure 2:
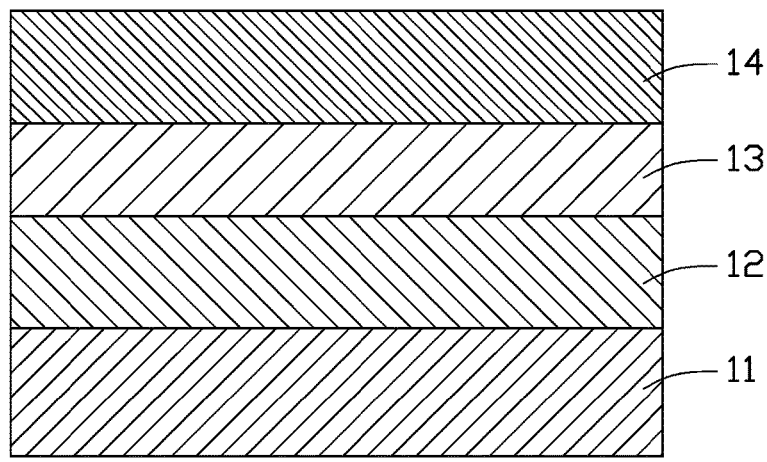
FIG. 2 is a cross-sectional view of a stacked structure in the light emitting diode of FIG. 1.

At block 101, referring to FIG. 2, a stacked structure 1 is provided.

The stacked structure 1 comprises a base 11, a N-semiconductor layer 12, a light active layer 13, and a P-semiconductor layer 14 arranged in that sequence from a bottom to a top.

Figure 3:
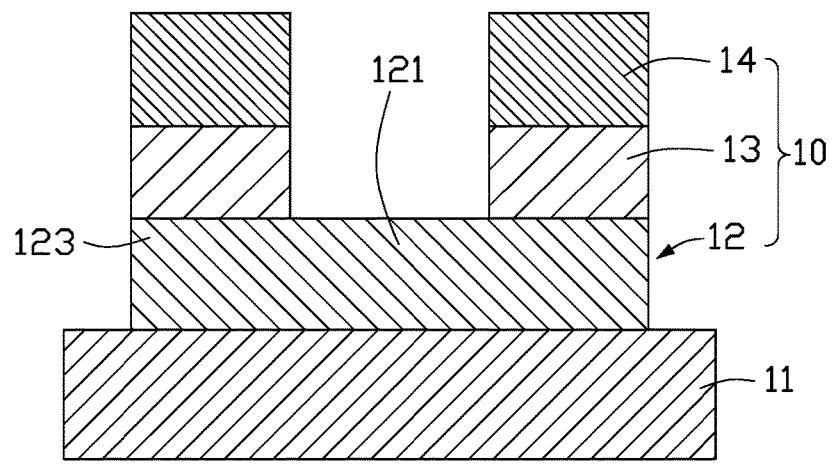
FIG. 3 is a cross-sectional view showing a semiconductor structure being formed by etching the stacked structure of FIG. 2.

At block 102, referring to FIG. 3, the N-semiconductor layer 12, the light active layer 13, and the P-semiconductor layer 14 are etched along a direction from the top to the bottom, to together form a semiconductor structure 10 which is U-shaped. A peripheral region of the base 11 is exposed. The etched N-semiconductor layer 12 of the semiconductor structure 10 comprises a first portion 121 and a second portion 123. Second portion 123 is connected to a periphery of the first portion 121. The first portion 121 is exposed. The second portion 123 is covered by the etched light active layer 13 of the semiconductor structure 10.

Figure 4:
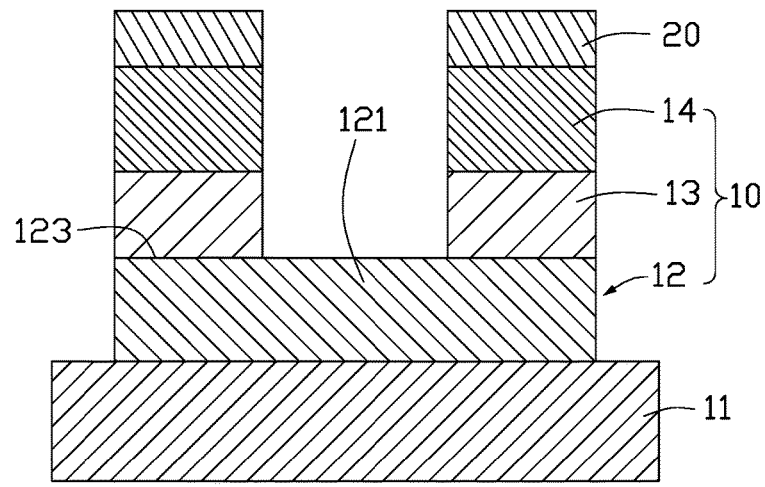
FIG. 4 is a cross-sectional view showing a first conductive film formed on a etched N-semiconductor layer of the semiconductor structure of FIG. 3.

At block 103, referring to FIG. 4, a first conductive film 20 is formed on a surface of the etched P-semiconductor layer 14 of the semiconductor structure 10 facing away from the etched light active layer 13.

Figure 5:
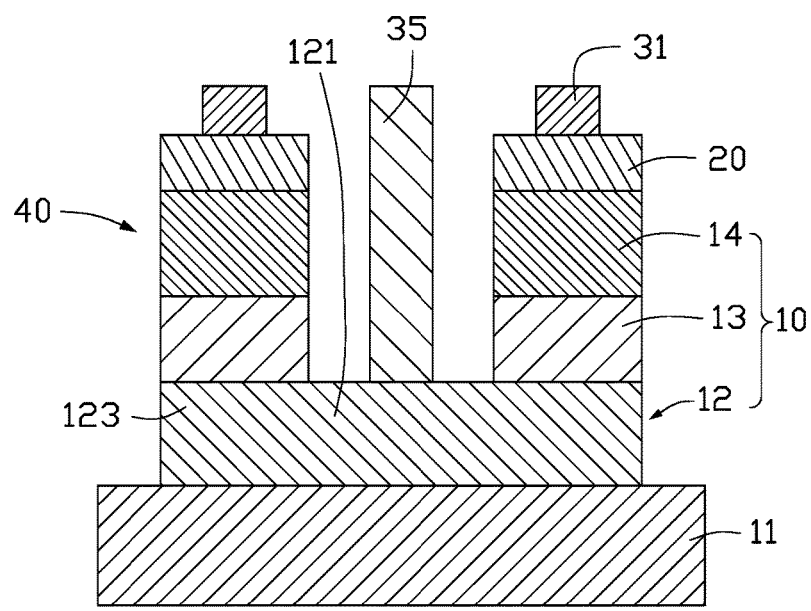
FIG. 5 is a cross-sectional view showing a first electrode formed on the semiconductor structure of FIG. 4 and a second electrode formed on the first conductive film of FIG. 4 to form a light emitting diode chip.

At block 104, referring to FIG. 5, a first electrode 31 is formed on a surface of the first conductive film 20 facing away from the etched P-semiconductor layer 14, and a second electrode 35 is formed on a surface of the first portion 121 facing away from the base 11. The first electrode 31 is separated from the second electrode 35. The semiconductor structure 10, the first conductive film 20, the first electrode 31, and the second electrode 35 together form a light emitting diode chip 40.

In at least one exemplary embodiment, a surface of the first electrode 31 facing away from the base 11 is flush with a surface of the second electrode 35 facing away from the base 11.

Figure 6:
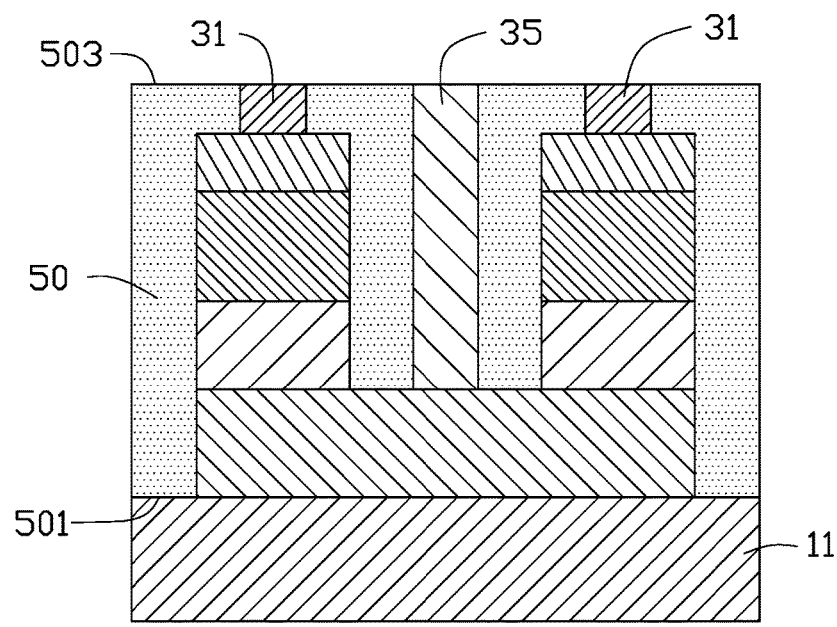
FIG. 6 is a cross-sectional view showing a packaging layer covering the light emitting diode chip of FIG. 5.

At block 105, referring to FIG. 6, a packaging layer 50 is formed to cover the light emitting diode chip 40 and expose the first electrode 31 and the second electrode 35.

In at least one exemplary embodiment, the packaging layer 50 comprises a first surface 501 and a second surface 503 facing away from the first surface 501. The first surface 501 is connected to the base 11. The second surface 503 is flush with the surface of the first electrode 31 and the surface of the second electrode 35.

Figure 7:
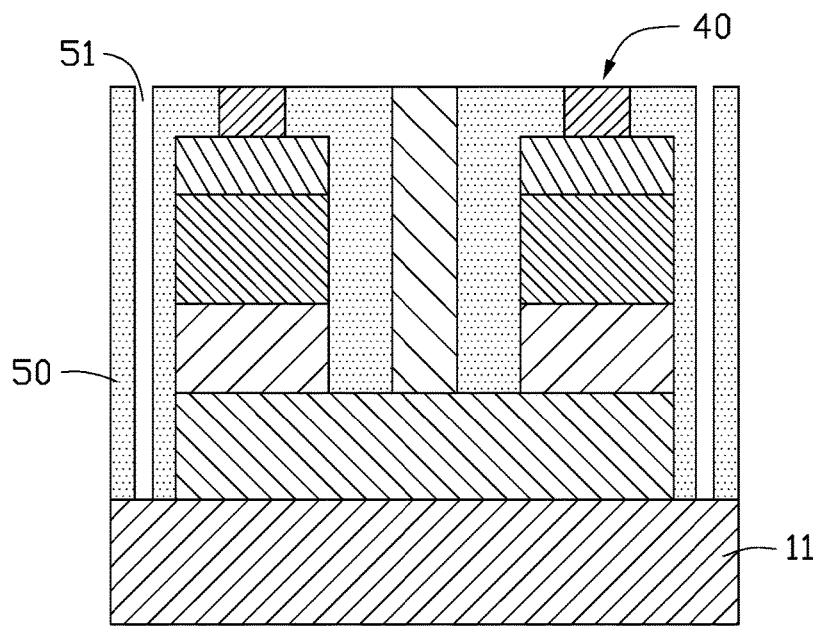
FIG. 7 is a cross-sectional view showing a through hole defined on the packaging layer of FIG. 6.

At block 106, referring to FIG. 7, a through hole 51 is defined on a region of the packaging layer 50 corresponding to the peripheral region of the base 11, along the direction from the top to the bottom. The through hole is separated from a periphery of the light emitting diode chip 40.

Figure 8:
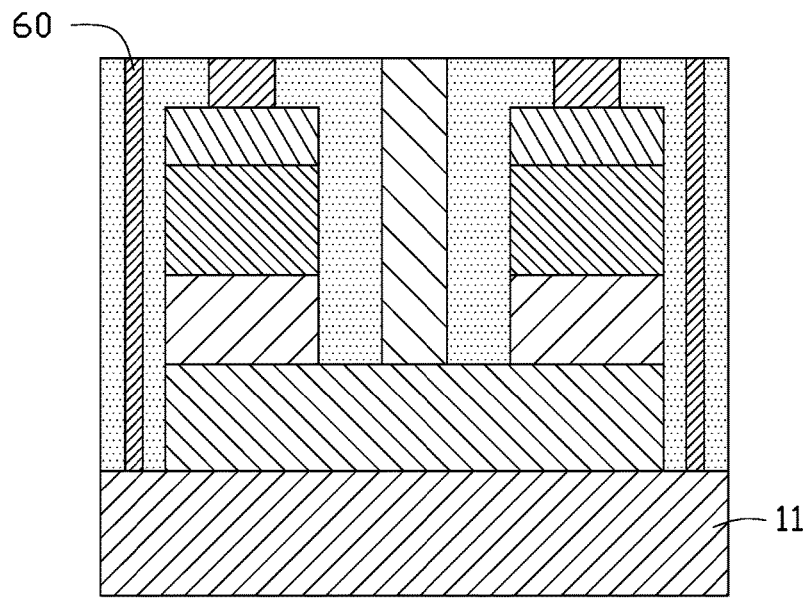
FIG. 8 is a cross-sectional view showing a conductive substrate fully infilled in the through hole of FIG. 7.

At block 107, referring to FIG. 8, a conductive substrate 60 is fully infilled in the through hole 51.

In at least one exemplary embodiment, the conductive substrate 60 is a copper conductive substrate.

Figure 9:
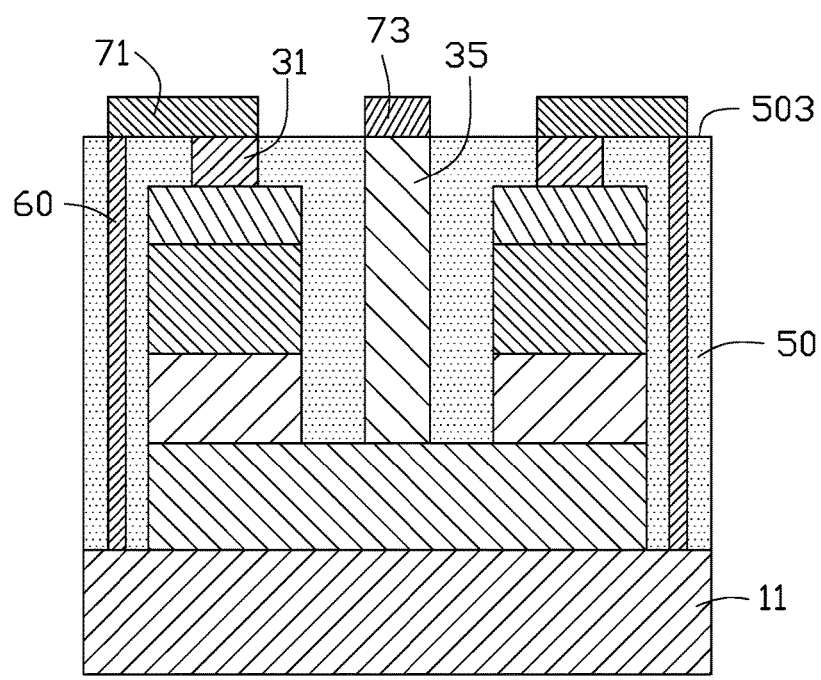
FIG. 9 is a cross-sectional view showing a first conductive layer electrically connected to the conductive substrate and the first electrode of FIG. 8, and a second conductive layer formed on the second electrode of FIG. 8.

At block 108, referring to FIG. 9, a first conductive layer 71 is formed on the second surface 503, and the first conductive layer 71 is electrically connected to the conductive substrate 60 and the first electrode 31. A second conductive layer 73 is formed on a surface of the second electrode 35 facing away from the etched N-semiconductor layer 12.

In at least one exemplary embodiment, the first conductive layer 71 and the second conductive layer 73 are made of tin. A surface of the first conductive layer 71 facing away from the second surface 503 is flush with a surface of the second conductive layer 73 facing away from the second surface 503.

In another exemplary embodiment, the first conductive layer 71 and the second conductive layer 73 are made of other conductive material.

Figure 10:
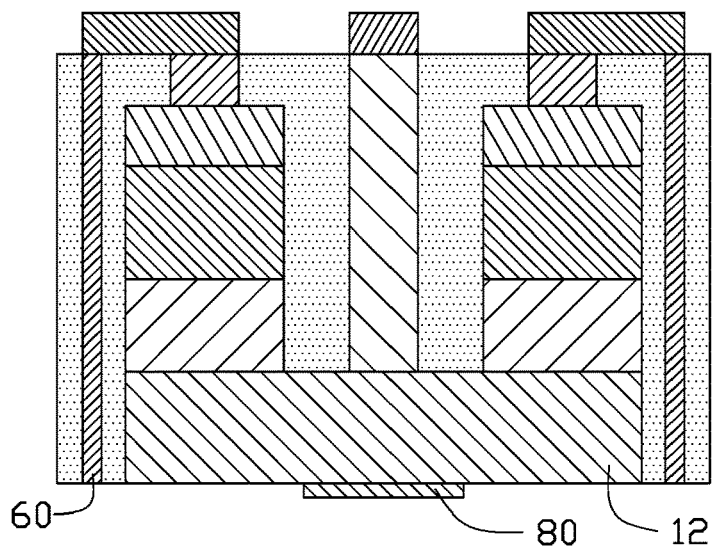
FIG. 10 is a cross-sectional view showing the base removed, and a second conductive film formed on the etched N-semiconductor layer of FIG. 9.

At block 109, referring to FIG. 10, the base 11 is removed, to expose the etched N-semiconductor layer 12 and the conductive substrate 60. A second conductive film 80 is formed on a surface of the etched N-semiconductor layer 12 facing away from the second electrode 35.

Figure 11:
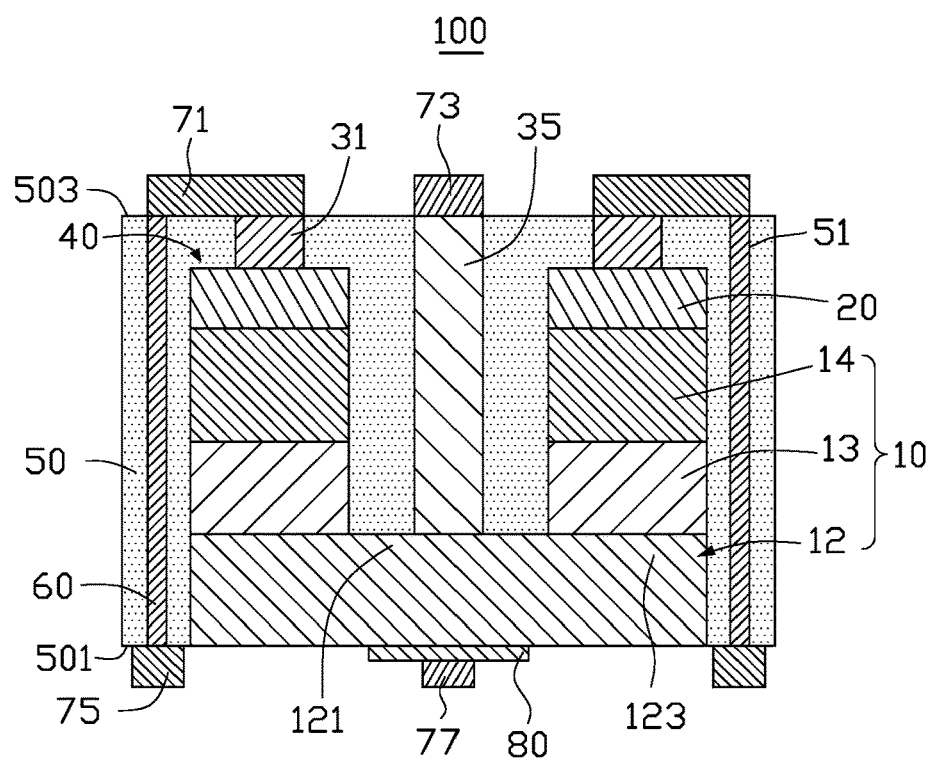
FIG. 11 is a cross-sectional view showing a third conductive layer formed on the conductive substrate facing away from the first conductive layer, and a fourth conductive layer formed on the second conductive film of FIG. 10.

At block 110, referring to FIG. 11, a third conductive layer 75 is formed on a surface of the conductive substrate 60 facing away from the first conductive layer 71, and a fourth conductive layer 77 is formed on a surface of the second conductive film 80 facing away from the etched N-semiconductor layer 12.

In at least one exemplary embodiment, the third conductive layer 75 and the fourth conductive layer 77 are made of tin. A surface of the third conductive layer 75 facing away from the conductive substrate 60 is flush with a surface of the fourth conductive layer 77 facing away from the second conductive film 80.

In another exemplary embodiment, the third conductive layer 75 and the fourth conductive layer 77 are made of other conductive material.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

Figure 12:
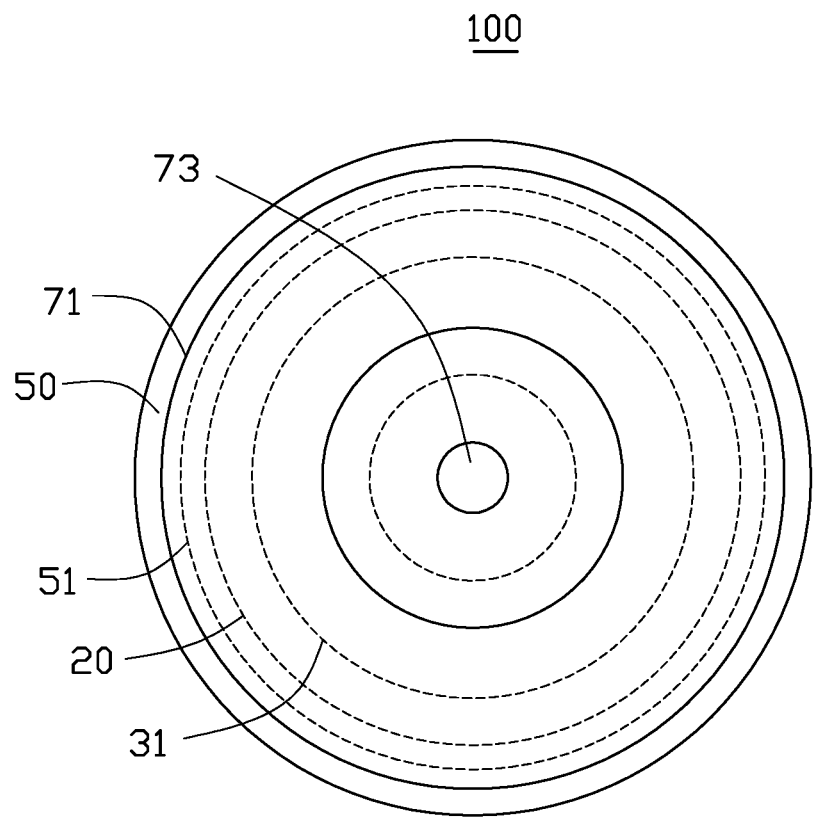
FIG. 12 is a top view of the light emitting diode of FIG. 11.

FIG. 11 illustrates an exemplary embodiment of a light emitting diode 100. In at least one exemplary embodiment, referring to FIG. 12, the light emitting diode 100 is circular viewed from above. In another exemplary embodiment, a top view of the light emitting diode 100 can be rectangular, triangular, oval, or polygonal.

The light emitting diode 100 comprises a light emitting diode chip 40, a packaging layer 50, a conductive substrate 60, and a first conductive layer 71.

The light emitting diode chip 40 comprises a semiconductor structure 10, a first electrode 31, and a second electrode 35. The semiconductor structure 10 comprises an N-semiconductor layer 12, a light active layer 13, and a P-semiconductor layer 14 arranged in that sequence from a bottom to a top. The first electrode 31 is formed on a surface of the P-semiconductor layer 14 facing away from the light active layer 13. The second electrode 35 is formed on a surface of the N-semiconductor layer 12 connected with the light active layer 13.

The packaging layer 50 covers the light emitting diode chip 40, but exposes the N-semiconductor layer 12, the first electrode 31, and the second electrode 35. A through hole 51 is defined on the packaging layer 50 along the direction from the top to the bottom. The through hole 51 is separated from a periphery of the light emitting diode chip 40.

The conductive substrate 60 is fully infilled in the through hole 51. The first conductive layer 71 is formed on a surface of the conductive substrate 60 close to the first electrode 31. The first conductive layer 71 is electrically connected to the first electrode 31 and the conductive substrate 60. In this way, two opposite surfaces of the light emitting diode 100 can, top to bottom, be electrically connected to other electronic elements (such as circuit board) for power. An installation of light emitting diode 100 is faster and more convenient.

Further, the semiconductor structure 10 is U-shaped. The N-semiconductor layer 12 comprises a first portion 121 and a second portion 123 which is connected to a periphery of the first portion 121. The first portion 121 is exposed. The second portion 123 is covered by the light active layer 13. The second electrode 35 is formed on the first portion 121.

Further, a first conductive film 20 is sandwiched between the first electrode 31 and the P-semiconductor layer 14, to improve a bonding force between the first electrode 31 and the P-semiconductor layer 14.

Further, a surface of the first electrode 31 facing away from the N-semiconductor layer 12 is flush with the a surface of the second electrode 35 facing away from the N-semiconductor layer 12.

Further, the packaging layer 50 comprises a first surface 501 and a second surface 503 facing away from the first surface 501. The first surface 501 is flush with a surface of the N-semiconductor layer 12 facing away from the light active layer 13. The second surface 503 is flush with the surface of the first electrode 31 and the surface of the second electrode 35.

The light emitting diode 100 further comprises a second conductive layer 73. The second conductive layer 73 is formed on the surface of the second electrode 35 facing away from the N-semiconductor layer 12.

The light emitting diode 100 further comprises a third conductive layer 75 and a fourth conductive layer 77. The third conductive layer 75 is formed on a surface of the conductive substrate 60 facing away from the first conductive layer 71. The fourth conductive layer 77 is formed on the surface of the N-semiconductor layer 12 facing away from the second electrode 35.

Further, a second conductive film 80 is sandwiched between the fourth conductive layer 77 and the N-semiconductor layer 12, to improve a bonding force between the fourth conductive layer 77 and the N-semiconductor layer 12.

In at least one exemplary embodiment, the first conductive layer 71, the second conductive layer 73, the third conductive layer 75, and the fourth conductive layer 77 are made of tin.

In at least one exemplary embodiment, a surface of the first conductive layer 71 facing away from the conductive substrate 60 is flush with a surface of the second conductive layer 73 facing away from the second electrode 35. A surface of the third conductive layer 75 facing away from the conductive substrate 60 is flush with a surface of the fourth conductive layer 77 facing away from the N-semiconductor layer 12.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a light emitting diode comprising:
    providing a light emitting diode chip formed on a base, wherein the light emitting diode chip does not cover a peripheral region of the base, the light emitting diode chip comprises a semiconductor structure, a first electrode, and a second electrode, the semiconductor structure comprises a etched N-semiconductor layer, a etched light active layer, and a etched P-semiconductor layer arranged in that sequence from a bottom to a top, the first electrode is formed on a surface of the etched P-semiconductor layer facing away from the etched light active layer, the second electrode is formed on a surface of the etched N-semiconductor layer connected to the light active layer;
    forming a packaging layer to cover the etched light emitting diode chip, the packaging layer exposing the first electrode and the second electrode;
    defining a through hole on a region of the packaging layer corresponding to the peripheral region of the base, along a direction from the top to the bottom, and the through hole separated from a periphery of the light emitting diode chip;
    forming a conductive substrate fully infilled in the through hole;
    forming a first conductive layer on a surface of the conductive substrate facing away from the base, and the first conductive layer connected to the conductive substrate and the first electrode; and
    removing the base.

2. The method of the claim 1, wherein the light emitting diode chip is formed on the base by the following steps:
    providing a stacked structure comprising a base, a N-semiconductor layer, a light active layer, and a P-semiconductor layer arranged in that sequence from a bottom to a top;
    etching the N-semiconductor layer, the light active layer, and the P-semiconductor layer along a direction from the top to the bottom, to together form a semiconductor structure which is U-shaped, a peripheral region of the base exposed, the etched N-semiconductor layer comprising a first portion and a second portion connected to a periphery of the first portion, the first portion exposed, and the second portion covered by the etched light active layer; and
    forming a first electrode on a surface of the etched P-semiconductor layer facing away from the etched light active layer, and forming a second electrode on a surface of the first portion facing away from the base, the semiconductor structure, the first electrode, and the second electrode together form a light emitting diode chip.

3. The method of the claim 2, wherein after forming a first conductive layer, and before removing the base, the method further comprises:
    forming a second conductive layer on a surface of the second electrode facing away from the etched N-semiconductor layer.

4. The method of the claim 3, wherein a surface of the first conductive layer facing away from the conductive substrate is flush with a surface of the second conductive layer facing away from the second electrode.

5. The method of the claim 2, wherein after removing the base, the method further comprises:
    forming a third conductive layer on a surface of the conductive substrate facing away from the first conductive layer.

6. The method of the claim 5, wherein after removing the base, the method further comprises:
    forming a fourth conductive layer on a surface of the etched N-semiconductor layer facing away from the second electrode.

7. The method of the claim 6, wherein a surface of the third conductive layer facing away from the conductive substrate is flush with a surface of the fourth conductive layer facing away from the N-semiconductor layer.

* * * * *